(12) United States Patent
So

(10) Patent No.: US 7,211,475 B2
(45) Date of Patent: May 1, 2007

(54) CMOS THIN FILM TRANSISTOR

(75) Inventor: Woo-Young So, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 221 days.

(21) Appl. No.: 10/978,376

(22) Filed: Nov. 2, 2004

(65) Prior Publication Data

US 2005/0095758 A1    May 5, 2005

Related U.S. Application Data

(62) Division of application No. 10/237,875, filed on Sep. 10, 2002, now Pat. No. 6,933,526.

(30) Foreign Application Priority Data

Dec. 19, 2001  (KR) ................ 2001-81326

(51) Int. Cl.
H01L 21/00     (2006.01)
(52) U.S. Cl. .................................... 438/154
(58) Field of Classification Search ................ 438/154
See application file for complete search history.

(56) References Cited

U.S. PATENT DOCUMENTS

| | | | |
|---|---|---|---|
| 5,403,772 A | 4/1995 | Zhang et al. | |
| 5,488,000 A | 1/1996 | Zhang et al. | |
| 5,773,327 A | 6/1998 | Yamazaki et al. | |
| 6,034,748 A | 3/2000 | Furuta | |
| 6,103,558 A | 8/2000 | Yamanaka et al. | |
| 6,207,481 B1 | 3/2001 | Yi et al. | |
| 6,399,959 B1 | 6/2002 | Chang et al. | |
| 6,475,835 B1 | 11/2002 | Hu et al. | |
| 6,596,573 B2 | 7/2003 | Lee et al. | |
| 6,703,289 B2 * | 3/2004 | Muramatsu et al. | 438/486 |
| 6,815,267 B2 | 11/2004 | So | |
| 2001/0000627 A1 | 5/2001 | Hayakawa et al. | |
| 2001/0018240 A1 | 8/2001 | Joo et al. | |
| 2001/0034088 A1 | 10/2001 | Nakamura et al. | |
| 2001/0045559 A1 | 11/2001 | Yamazaki et al. | |

(Continued)

FOREIGN PATENT DOCUMENTS

CN      1198596 A     11/1998

(Continued)

OTHER PUBLICATIONS

U.S. Appl. No. 10/298,559, filed Nov. 19, 2002, Woo-Young So, Samsung SDI Co., Ltd.

(Continued)

*Primary Examiner*—Lex H. Malsawma
(74) *Attorney, Agent, or Firm*—Stein, McEwen & Bui, LLP

(57) ABSTRACT

A CMOS thin film transistor having a semiconductor layer formed in a zigzag form on an insulating substrate, and a PMOS transistor region and an NMOS transistor region and a gate electrode having at least one slot crossing the semiconductor layer, wherein the semiconductor layer has an MILC surface existing on the PMOS transistor region and the NMOS transistor region, and the method of manufacturing the same, whereby a manufacturing process of the CMOS TFT is simple and the leakage current is decreased.

5 Claims, 6 Drawing Sheets

U.S. PATENT DOCUMENTS

| | | |
|---|---|---|
| 2001/0074548 | 6/2002 | Lee et al. |
| 2002/0074548 A1 | 6/2002 | Lee et al. |
| 2002/0137267 A1 | 9/2002 | Joo et al. |
| 2002/0146869 A1 | 10/2002 | So |
| 2003/0111691 A1 | 6/2003 | So |

FOREIGN PATENT DOCUMENTS

| | | |
|---|---|---|
| CN | 1053292 C | 6/2000 |
| EP | 1 052 700 | 11/2000 |
| EP | 1 054 452 A2 | 11/2000 |
| JP | 06-244205 | 9/1994 |
| JP | 09-293879 | 11/1997 |
| JP | 10-135137 | 5/1998 |
| JP | 10-154816 | 9/1998 |
| JP | 10-284734 | 10/1998 |
| JP | 2001-7335 | 1/2001 |
| JP | 2001-144027 | 5/2001 |

OTHER PUBLICATIONS

U.S. Appl. No. 10/890,999, filed Jul. 15, 2004, Woo-Young So, Samsung SDI Co., Ltd.

U.S. Appl. No. 10/237,875, filed Sep. 10, 2002, Woo-Young So, Samsung SDI Co., Ltd.

* cited by examiner

CMOS THIN FILM TRANSISTOR

CROSS-REFERENCE TO RELATED APPLICATIONS

This application is a divisional application of U.S. Ser. No. 10/237,875 filed Sep. 10, 2002, now U.S. Pat. No. 6,933,526 and also claims the benefit of Korean Patent Application No. 2001-81326 filed on Dec. 19, 2001, in the Korean Industrial Property Office, the disclosure of which is incorporated herein by reference.

BACKGROUND OF THE INVENTION

1. Field of the Invention

The present invention relates to a CMOS thin film transistor and a method of manufacturing the same. More particularly, the present invention relates to a CMOS thin film transistor and a method of manufacturing the same using a metal induced lateral crystallization (MILC) technique.

2. Description of the Related Art

A poly-silicon layer has been generally formed such that an amorphous silicon layer is deposited on a substrate and is crystallized at a predetermined temperature. A technique to crystallize the amorphous silicon layer includes a solid phase crystallization (SPC), an excimer laser annealing (ELA), and a metal induced lateral crystallization (MILC).

Of the techniques, the MILC has advantages in that a process temperature is low and a processing time is short compared to the other techniques. U.S. Pat. No. 5,773,327 discloses a method of manufacturing a thin film transistor (TFT) by crystallizing the amorphous silicon layer using the MILC technique. The U.S. Pat. No. 5,773,327 has disadvantages in that an additional mask is required to define an MILC region, and an MILC surface acting as defects exists in a channel region. The MILC surface is a portion in which two surfaces of crystallized polysilicon grown in opposite directions by the MILC technique meet.

Meanwhile, a multiple gate is employed to prevent a leakage current. In this case, a dimension of the TFT region is increased, and a distance between metal layers to perform the MILC process is also increased, thereby increasing a crystallization time.

SUMMARY OF THE INVENTION

Accordingly, it is an object of the present invention to provide a CMOS thin film transistor having a multiple gate without increasing a dimension thereof.

It is another object of the present invention to provide a CMOS thin film transistor having excellent electrical characteristics.

It is still another object of the present invention to provide a CMOS thin film transistor having a short processing time.

Additional objects and advantages of the invention will be set forth in part in the description which follows and, in part, will be obvious from the description, or may be learned by practice of the invention.

The foregoing and other objects of the present invention are achieved by providing a CMOS thin film transistor, comprising: a semiconductor layer formed in a zigzag form on an insulating substrate, and having a PMOS transistor region and an NMOS transistor region and a gate electrode having at least one slot crossing the semiconductor layer, wherein the semiconductor layer has an MILC surface existing on the PMOS transistor region and the NMOS transistor region, wherein the MILC surface is a portion in which two surfaces of crystallized polysilicon grown in opposite directions by the MILC technique meet.

Also, the semiconductor layer includes a plurality of body portions crossing the slot of the gate electrode, and a plurality of connection portions to connect the neighboring body portions.

A portion of the semiconductor layer in which the PMOS transitor region overlaps the gate electrode serves as a channel region of the PMOS transistor, and a portion of the semiconductor layer in which the NMOS transitor region overlaps the gate electrode serves as a channel region of the NMOS transistor.

A portion of the gate electrode overlapping the PMOS transistor region serves as a multiple gate of the PMOS transistor, and a portion of the gate electrode overlapping the NMOS transistor region serves as a multiple gate of the NMOS transistor.

The foregoing and other objects of the present invention may also be achieved by providing a CMOS thin film transistor, comprising: a semiconductor layer formed in a zigzag form and a gate electrode having at least one gate crossing the semiconductor layer, wherein the semiconductor layer has MILC surfaces between a PMOS transistor region and a neighboring gate of the gate electrode and between an NMOS transistor region and a neighboring gate of the gate electrode.

The semiconductor layer includes a plurality of body portions crossing the gate of the gate electrode, and a plurality of connection portions to connect neighboring body portions.

A part of the body portion of the semiconductor layer overlapping the respective gate of the gate electrode in the PMOS transistor region serves as a channel region of the PMOS transistor, and a portion of the body part of the semiconductor layer overlapping the respective gate of the gate electrode in the NMOS transistor region serves as a channel region of the NMOS transistor.

The foregoing and other objects of the present invention may also be achieved by providing a method of manufacturing a CMOS thin film transitor, comprising: forming an amorphous silicon layer having a zigzag shape on an insulating substrate, the amorphous silicon layer having a PMOS transistor region and an NMOS transistor; forming a gate insulating layer over the entire surface of the substrate; forming a gate electrode having at least one slot crossing the amorphous silicon layer on the gate insulating layer; forming an interlayer insulating layer over the entire surface of the substrate having a contact hole exposing both edges of the PMOS transistor region and the NMOS transistor region; forming a metal layer to contact the exposed portion of the amorphous silicon layer via the contact hole; crystallizing the amorphous silicon layer using an MILC to form a poly silicon layer, thereby forming a semiconductor layer; and forming source and drain electrodes contacting the semiconductor layer via the contact hole.

The forming of the source and drain electrodes includes removing the metal layer, depositing a source/drain electrode material, and patterning the source/drain electrode material.

The forming of the source and drain electrodes includes a source/drain electrode material on the metal layer, and patterning the source/drain electrode material and the metal layer in sequence, whereby the source and drain electrodes have a dual-layered structure.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1A:
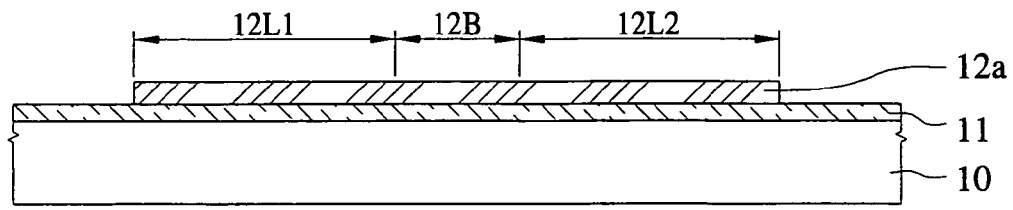
FIGS. 1A to 1D are cross-sectional views illustrating a process of manufacturing a CMOS thin film transistor with a dual gate using an MILC technique according to an embodiment of the present invention taken along line "II—II" of FIG. 2D.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Reference will now be made in detail to the embodiments of the present invention, an example of which is illustrated in the accompanying drawings.

Hereinafter, an MILC surface is a portion in which two surfaces of crystallized polysilicon grown in opposite directions by an MILC technique meet.

FIGS. 1A to 1D are plan views illustrating a process of manufacturing a CMOS thin film transistor with a dual gate using an MILC technique according to an embodiment of the present invention. FIGS. 2A to 2D are cross-sectional views taken along the line "II—II" of FIG. 1D.

Figure 2A:
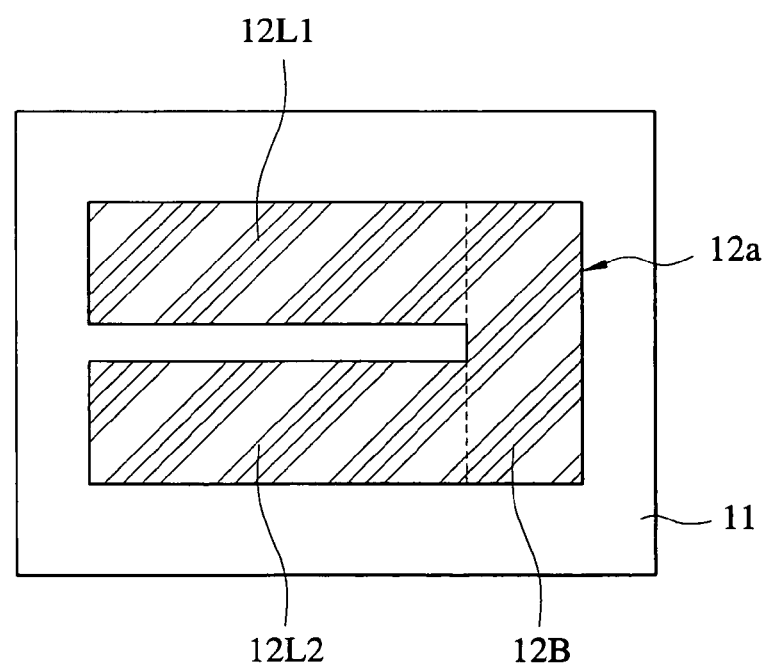
FIGS. 2A to 2D are plan views illustrating a process of manufacturing a CMOS thin film transistor with a dual gate using an MILC technique according to the embodiment of the present invention.
Figure 2B:
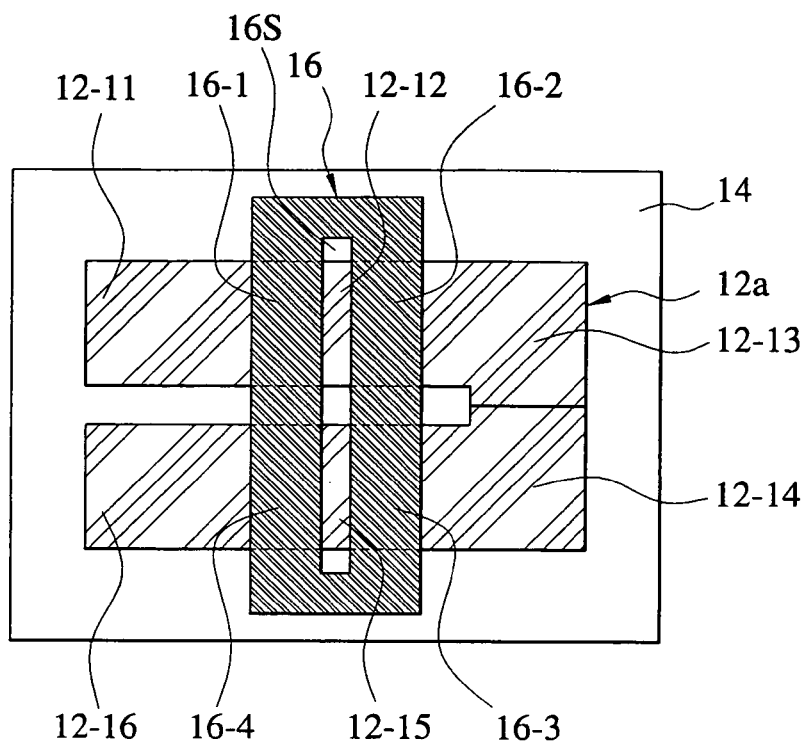
Figure 5:
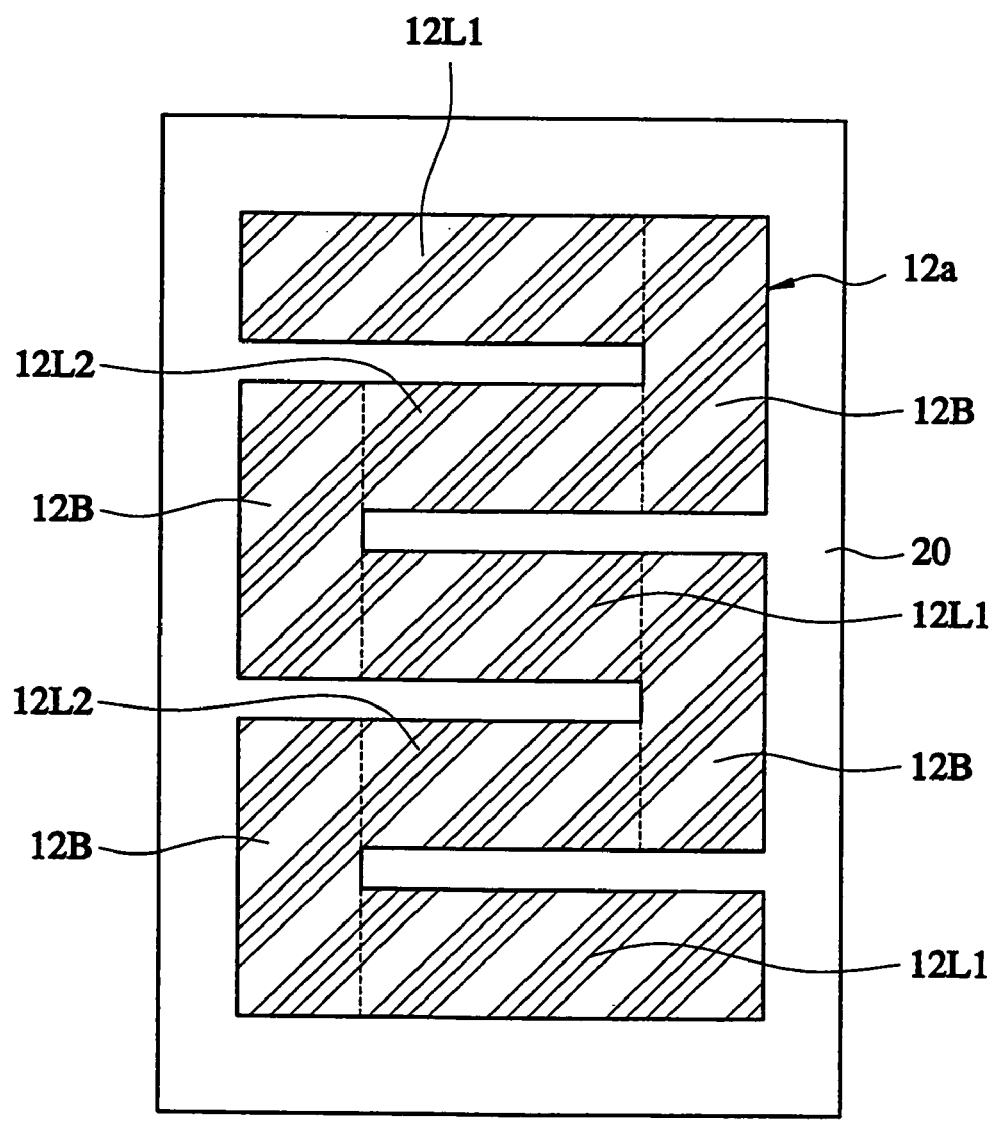
FIG. 5 is a plan view showing a semiconductor layer of a zigzag shape according to an embodiment of the present invention.

Referring to FIGS. 1A and 2A, a buffer layer 11 is formed on an insulating substrate 10 made of, e.g., glass. An amorphous silicon layer is deposited on the buffer layer 11 and patterned to form a semiconductor layer 12a. The semiconductor layer 12a preferably has a rectangular shape wherein one side is opened, and includes first and second body portions 12L1 and 12L2 and a connection portion 12B to connect the body portions 12L1 and 12L2. A shape of the semiconductor layer 12a is not limited to this shape as shown in FIG. 2B. As shown in FIG. 5, the semiconductor layer 12a can have a zigzag shape such that a plurality of body portions 12L1 and 12L2 are arranged and a plurality of the body portions 12L1 and 12L2 are connected to connection portions 12B.

The first body portion 12L1 and a portion of the connection portion 12B define a PMOS transistor region, and the second body portion 12L2 and the rest of the connection portion 12B define an NMOS transistor region.

Figure 1B:
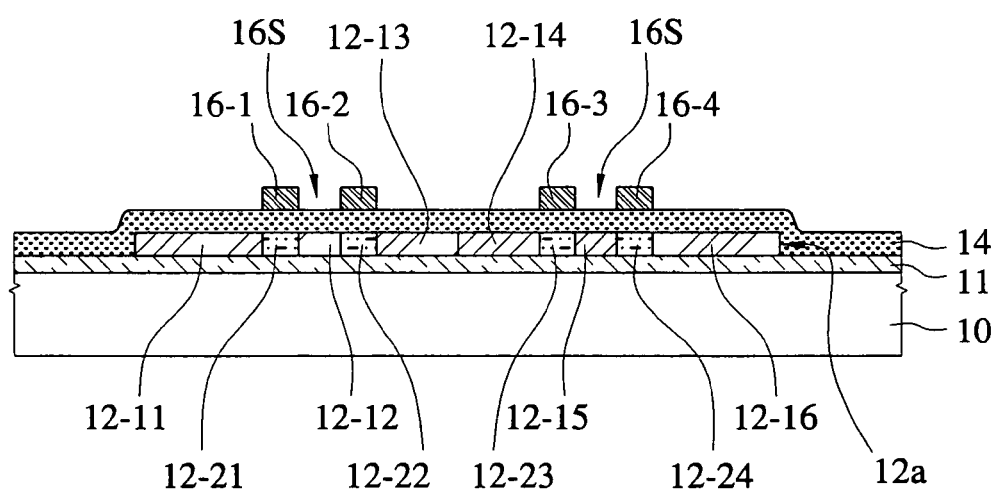

Referring to FIGS. 1B and 2B, a gate insulating layer 14 is formed over the entire surface of the substrate 10. A metal layer is deposited on the gate insulating layer 14 and patterned to form a gate electrode 16 having at least one slot 16S.

Here, the slot 16S of the gate electrode 16 crosses body portions 12L1 and 12L2 of the semiconductor layer 12a. Portions 16-1 and 16-2 of the gate electrode 16 that overlap the first body portion 12L1 of the semiconductor layer 12a serve as first and second gates of the PMOS transistor, respectively. Portions 16-3 and 16-4 of the gate electrode 16 that overlap the second body portion 12L2 of the semiconductor layer 12a serve as first and second gates of the NMOS transistor, respectively. Hence, a dual gate is obtained.

When the semiconductor layer 12a has a shape in which one side is opened and the gate has one slot, the gate electrode 16 of the CMOS thin film transistor has a dual-gate structure. When the semiconductor layer 12a has a zigzag shape in which a plurality of the body portions are connected by a plurality of connection portions, or when the gate electrode 16 has a plurality of slots, a multiple gate can be achieved.

Even though not shown, a photoresist film is formed on the NMOS transistor region, and thus the PMOS transistor region is exposed. A p-type impurity is ion-doped into the PMOS transistor region using the photoresist film and the gate electrode 16 as a mask to form doped regions 12-11 to 12-13 for source and drain regions. A portion of the semiconductor layer 12a corresponding to the first gate 16-1, i.e., a portion of the semiconductor 12a between the doped regions 12-11 and 12-12, serves as a first channel region 12-21 of the PMOS transistor. A portion of the semiconductor layer 12a corresponding to the second gate 16-2, i.e., a portion of the semiconductor 12a between the doped regions 12-12 and 12-13, serves as a second channel region 12-22 of the PMOS transistor.

After removing the photoresist film on the NMOS transistor, a photoresist film (not shown) is formed on a portion of the semiconductor layer 12a corresponding to the PMOS transistor region, thereby exposing a portion of the semiconductor layer 12a corresponding to the NMOS transistor region.

An n-type impurity is ion-doped into the exposed portion of the semiconductor layer 12a using the photoresist film and the gate electrode 16 as a mask to form doped regions 12-14 to 12-16 for source and drain regions. Thereafter, the remaining photoresist film is removed.

A portion of the semiconductor layer 12a between the doped regions 12-14 and 12-15 serves as a first channel region 12-23 of the NMOS transistor, and a portion of the semiconductor layer 12a between the doped regions 12-15 and 12-16 serves as a second channel region 15-24 of the NMOS transistor.

In an embodiment of the present invention, the source and drain regions of the NMOS transistor are formed after the source and drain regions of the PMOS transistor. However, the source and drain regions of the NMOS transistor can be formed before the source and drain regions of the PMOS transistor are formed.

Figure 1C:
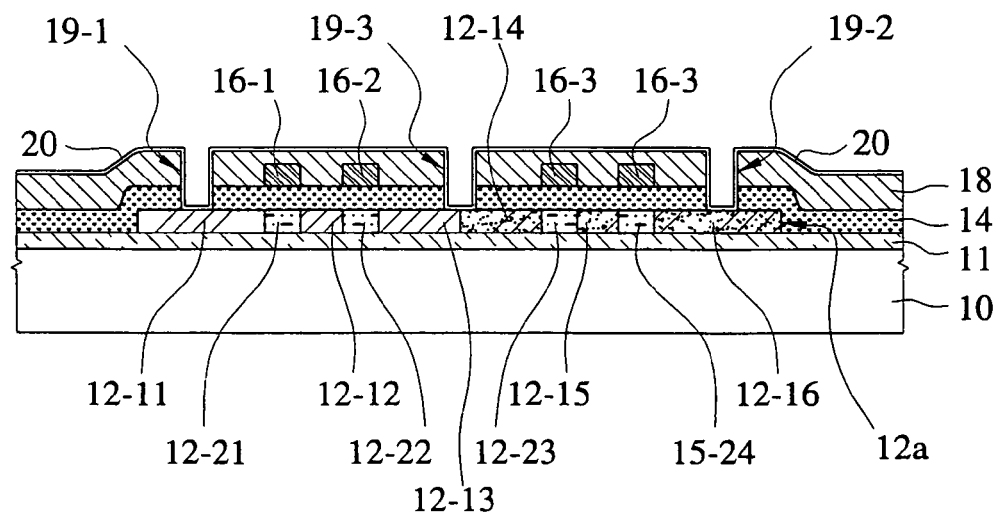
Figure 2C:
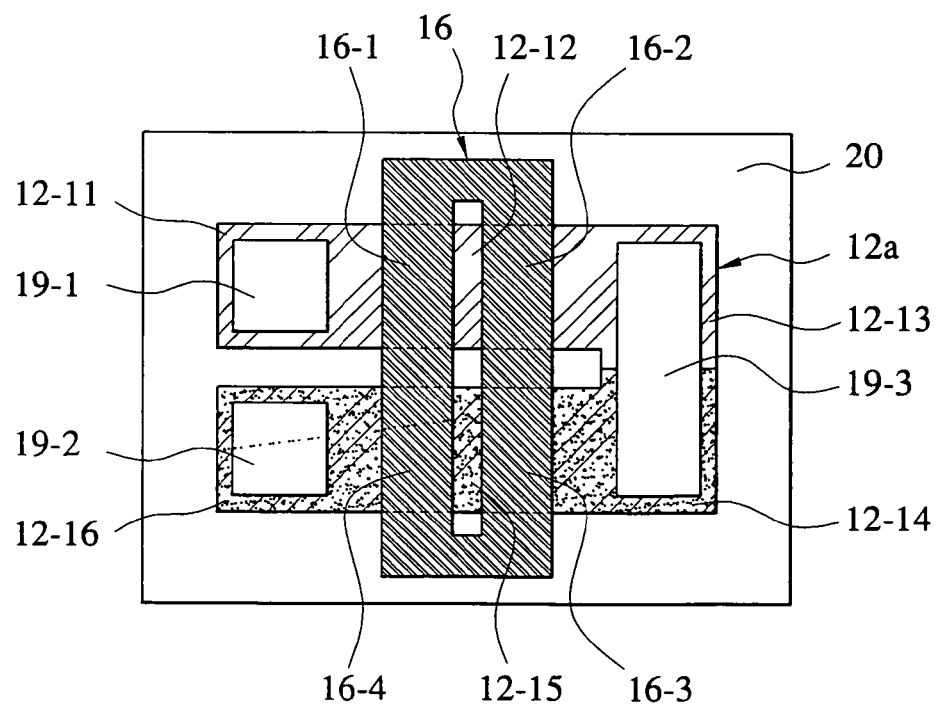

Referring to FIGS. 1C and 2C, an interlayer insulating layer 18 is formed over the entire surface of the substrate 10. The gate insulating layer 14 and the interlayer insulating layer 18 are etched to form contact holes 19-1 and 19-2 exposing a portion of the doped region 12-11 and a portion of the doped region 12-16, respectively, while simultaneously forming a contact hole 19-3 exposing portions of the doped regions 12-13 and 12-14.

Subsequently, a metal layer 20, such as Ni and Pd to form a metal silicide, is formed over the entire surface of the substrate 10 to a thickness of tens to hundreds of angstroms. The metal layer 20 directly contacts the doped regions 12-11 and 12-16 via the contact holes 19-1 and 19-2, respectively, and the doped regions 12-13 and 12-14 via the contact hole 19-3. The metal layer 20 serves as a catalytic layer during an MILC process, and contacts the semiconductor layer 12a through only the contact holes 19-1 to 19-3, so that a separate mask to pattern the metal layer 20 is not required.

Figure 1D:
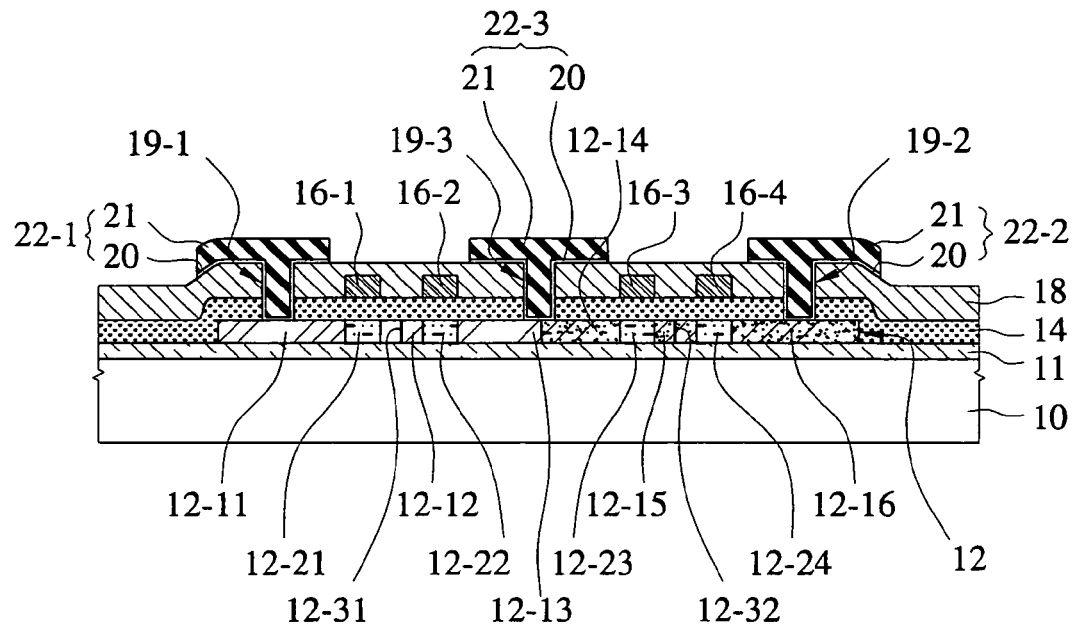
Figure 2D:
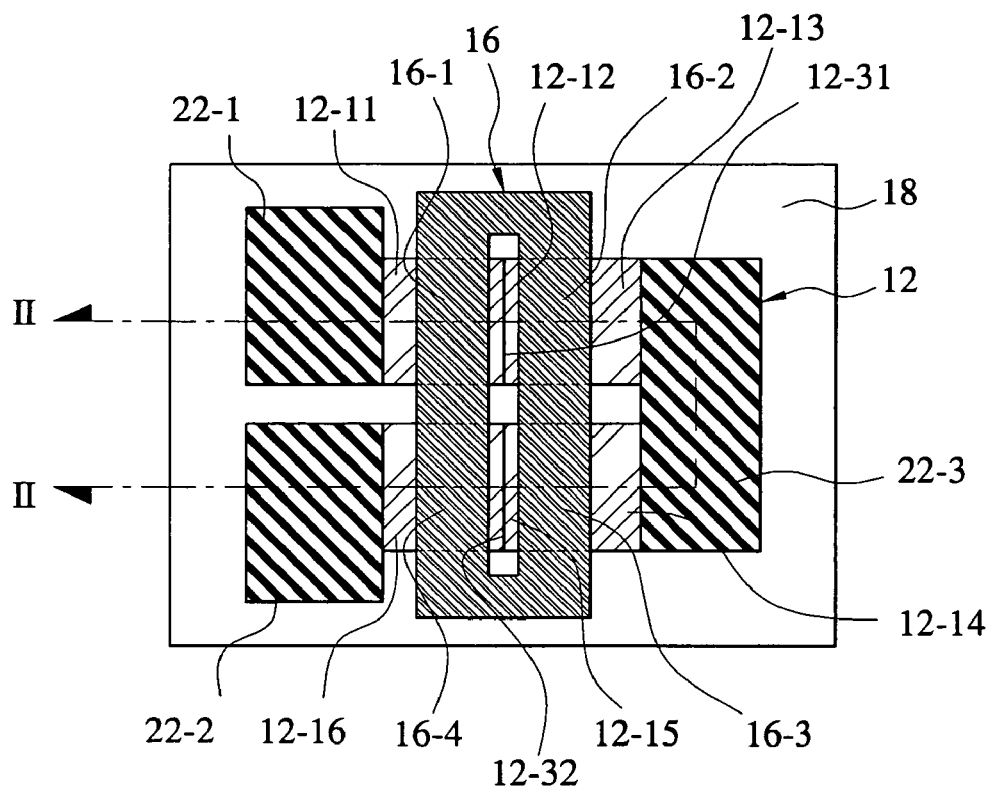

Referring to FIGS. 1D and 2D, the amorphous silicon layer 12a is crystallized by using the MILC technique to form the poly silicon layer 12. Here, MILC surfaces 12-31 and 12-32 do not exist in the first and second channel regions 12-21 and 12-22 of the PMOS transistor and the first and second channel regions 12-23 and 12-24 of the NMOS transistor, but in the slot 16S of the gate electrode 16. In other words, when the gate electrode 16 includes a plurality of the slots, the MILC surfaces exist in the doped region 12-12 and 12-15.

Subsequently, a metal layer 21 is deposited on the metal layer 20 and patterned to form a source electrode 22-1 of the PMOS transistor, a source electrode 22-2 of the NMOS transistor, and a drain electrode 22-3 of the PMOS and NMOS transistors.

The source electrode 22-1 of the PMOS transistor serves to receive a power voltage Vdd, the source electrode 22-2 of the NMOS transistor serves to receive a ground voltage GND, and the drain electrode 22-3 serves as an output terminal which is commonly connected to the drain region 12-13 of the PMOS transistor and the drain region 12-14 of the NMOS transistor. Even though not shown, the gate electrode 16, having a dual-gate structure, serves as an input terminal.

At this point, the metal layer 20 is not removed so that it can be used as the source electrodes 22-1 and 22-2 and the drain electrode 22-3. However, the source and drain electrodes 22-1 to 22-3 can be formed by the metal layer 21 instead of the metal layer 20 by removing the metal layer 20 after the MILC process.

Using the method of manufacturing the CMOS thin film transistor using the MILC, an additional masking process to form the metal layer for the MILC and a process of removing the metal layer after the MILC are not required, and thus the manufacturing process is simple. Further, since the MILC surface does not exist in the channel region, defects are prevented, thereby decreasing a leakage current.

In addition, since the MILC technique is performed from both directions, the number of slots is preferably odd so that the MILC surface exists on the slots other than the channel region. That is, the number of the multiple gates of the PMOS and NMOS transistors is preferably even. This is because the MILC surface exists on only the slots when the number of the slots is odd, whereas the MILC surface exists on the channel region when the number of the slots is even.

Figure 3:
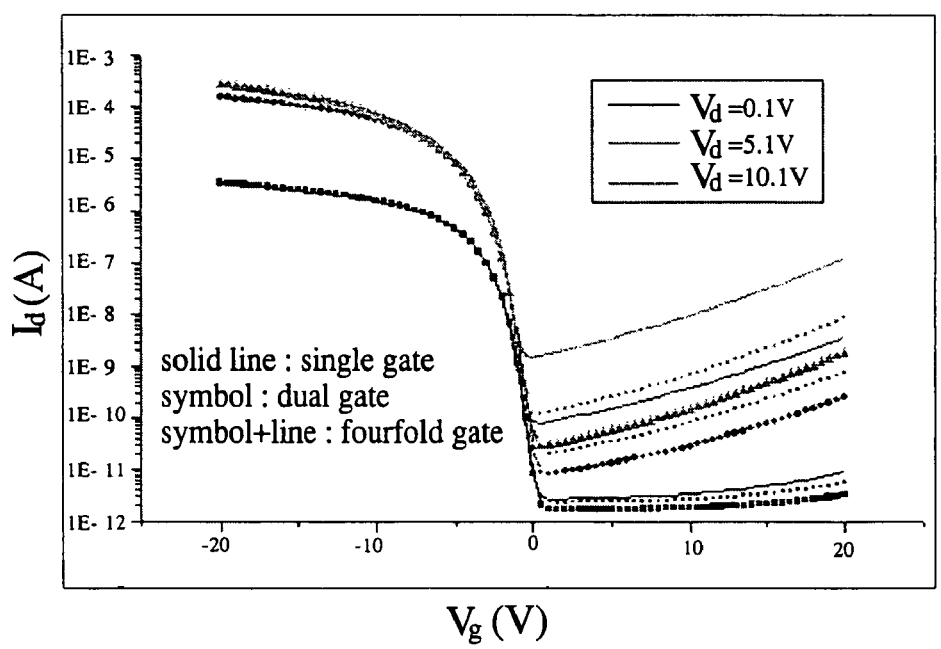
FIG. 3 is a graph illustrating a leakage current characteristic of the CMOS thin film transistor according to an embodiment of the present invention.

FIG. 3 is a graph illustrating a leakage current characteristic of the CMOS thin film transistor according to an embodiment of the present invention. As can be seen in FIG. 3, the leakage current is decreased in the dual gate or the fourfold gate more than the single gate.

Figure 4A:
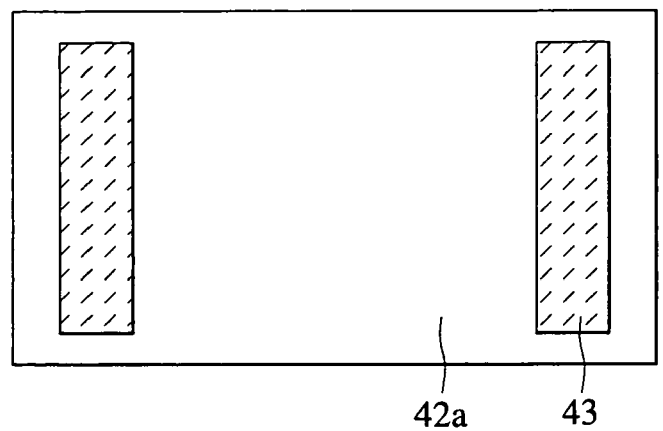
FIGS. 4A to 4C are plan views illustrating a method of manufacturing a CMOS thin film transistor having a multiple gate using the MILC technique according to another embodiment of the present invention.
Figure 4B:
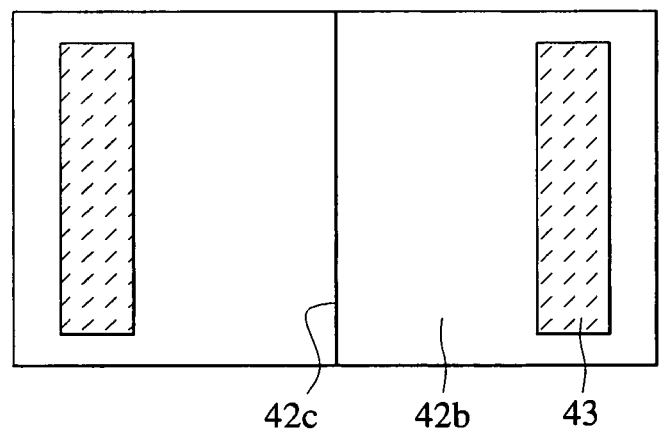
Figure 4C:
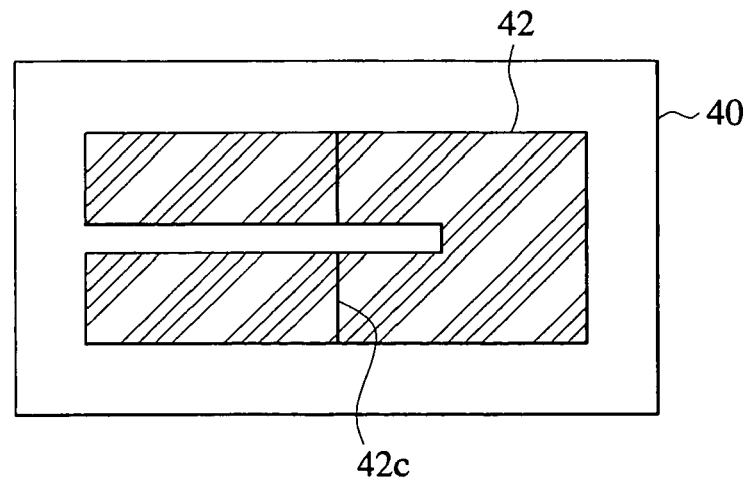

FIGS. 4A to 4C are plan views illustrating a method of manufacturing a CMOS thin film transistor having a multiple gate using the MILC technique according to another embodiment of the present invention. A semiconductor layer is formed by crystallizing an amorphous silicon layer using the MILC technique to form a poly silicon layer and then patterning the poly silicon layer.

Referring to FIG. 4A, an amorphous silicon layer 42a is deposited over an insulating substrate. A metal layer 43 as an MILC catalytic layer is formed on both edges of the amorphous silicon layer 42a.

Referring to FIG. 4B, an MILC for the amorphous silicon layer 42a is performed to form a poly silicon layer 42b. Thereafter, the metal layer 43 is removed.

Referring to FIG. 4C, the poly silicon layer 42b (see FIG. 4B) is patterned to form a semiconductor layer 42 having a rectangular shape in which one side is opened or has a zigzag shape.

Thereafter, subsequent processes are performed so that an MILC surface may exist on the slot of the gate electrode like the previous embodiment of the present invention to finally complete the CMOS thin film transistor according to another embodiment of the present invention.

Using the method of manufacturing the CMOS thin film transistor using the MILC, an additional masking process of forming the metal layer for the MILC and a process of removing the metal layer after the MILC are not required, and thus a manufacturing process is simple. Since the MILC surface does not exist in the channel region, the leakage current is decreased.

Further, since the CMOS thin film transistor having a multiple gate can be manufactured without requiring additional masks, a manufacturing cost and a processing time can be shortened.

Furthermore, since the semiconductor layer has a zigzag shape and the gate electrode has at least one slot crossing the semiconductor layer, a leakage current can be decreased without increasing a dimension. Consequently, reliability can be improved without greatly affecting an aperture ratio.

While the invention has been particularly shown and described with reference to preferred embodiments thereof, it will be understood by those skilled in the art that the foregoing and other changes in form and details may be made therein without departing from the spirit and scope of the invention.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a CMOS thin film transitor, comprising:

forming an amorphous silicon layer having a zigzag shape on an insulating substrate, the amorphous silicon layer having a PMOS transistor region and an NMOS transistor;

forming a gate insulating layer over the entire surface of the substrate;

forming a gate electrode having at least one slot crossing the amorphous silicon layer on the gate insulating layer;

forming an interlayer insulating layer over the entire surface of the substrate having a contact hole exposing both edges of the PMOS transistor region and the NMOS transistor region;

forming a metal layer to contact the exposed portion of the amorphous silicon layer via the contact hole;

crystallizing the amorphous silicon layer using an MILC to form a poly silicon layer, thereby forming a semiconductor layer; and forming source and drain electrodes contacting the semiconductor layer via the contact hole.

2. The method of claim 1, wherein the forming the source and drain electrode includes removing the metal layer, depositing a source/drain electrode material, and patterning the source/drain electrode material.

3. The method of claim 1, wherein the forming the source and drain electrodes includes depositing a source/drain electrode material on the metal layer, and pattering the source/drain electrode material and the metal layer in sequence, wherein the source and drain electrodes have a dual-layered structure.

4. A process of manufacturing a CMOS thin film transistor having a multiple gate comprising:
- depositing an amorphous silicon layer over an insulating substrate;
- forming a metal layer as an MILC catalytic layer on two edges of the amorphous silicon layer;
- performing MILC for the amorphous silicon layer to form a poly silicon layer;
- removing the metal layer; and
- patterning the poly silicon layer to form the semiconductor layer having a rectangular shape in which one side is opened or having a zigzag shape.

5. A method of manufacturing a CMOS transistor comprising:
- forming a buffer layer on an insulating substrate;
- depositing an amorphous silicon layer on the buffer layer and patterning the amorphous silicon layer to form a semiconductor layer having a first body portion, a second body portion and a connection portion to connect the first and second body portion, such that the first body portion and a portion of the connection portion define a PMOS transistor region and the second body portion and the rest of the connection portion define an NMOS transistor region;
- forming a gate insulation layer over the substrate;
- depositing a metal layer on the gate insulating layer to form gate electrodes having two gates and at least one slot, each gate electrode crossing the first and second body portions;
- forming a film on the NMOS transistor region;
- ion-doping the PMOS transistor region such that a portion of the semiconductor layer corresponding to the first gate serves as a first channel region of the PMOS transistor region and a portion of the semiconductor layer corresponding to the second gate serves as a second channel region of the PMOS transistor region to form first, second and third PMOS doped regions for source and drain regions;
- removing the film on the NMOS transistor region;
- forming a film on the PMOS transistor region;
- ion-doping the NMOS transistor region such that a portion of the semiconductor layer corresponding to the first gate serves as a first channel region of the NMOS transistor region and a portion of the semiconductor layer corresponding to the second gate serves as a second channel region of the NMOS transistor region to form first, second and third NMOS doped regions for source and drain regions;
- forming an interlayer insulating layer over the substrate;
- etching the gate insulating layer and the interlayer insulating layer to form first and second contact holes exposing a portion of the first PMOS doped region and a portion of the third NMOS doped region, while simultaneously forming a contact hole exposing portions of the third PMOS doped region and the first NMOS doped region;
- forming a metal layer over the substrate to contact the first PMOS doped region through the first contact hole, the third NMOS doped region through the second contact hole, and the third PMOS doped region and the first NMOS doped region through the third contact hole.

* * * * *